(12) United States Patent
Cher et al.

(10) Patent No.: US 9,863,994 B2
(45) Date of Patent: Jan. 9, 2018

(54) ON-CHIP LEAKAGE MEASUREMENT

(71) Applicant: International Business Machines Corporation, Armonk, NY (US)

(72) Inventors: Chen-Yong Cher, Port Chester, NY (US); Keith A. Jenkins, Sleepy Hollow, NY (US); Barry P. Linder, Hastings-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 15/060,497

(22) Filed: Mar. 3, 2016

(65) Prior Publication Data
US 2017/0254846 A1 Sep. 7, 2017

(51) Int. Cl.
*G01R 31/02* (2006.01)
*G01R 19/165* (2006.01)

(52) U.S. Cl.
CPC ......... *G01R 31/025* (2013.01); *G01R 19/165* (2013.01)

(58) Field of Classification Search
CPC ...... G06F 1/324; G06F 1/3206; G06F 1/3296; G06F 1/3203; G01C 19/5776; G01R 31/025; G01R 17/105; G01R 19/18; G01R 23/09; G01R 27/02; G01R 27/025; G01R 31/021; G01R 31/1263; G01R 31/2637; H02J 7/0065; H02J 7/244; H03K 17/165; H03K 17/14; H03L 7/0805; H03L 7/099; H03B 5/06; H03B 5/1835; H03B 5/364
See application file for complete search history.

(56) References Cited

U.S. PATENT DOCUMENTS

| | | |
|---|---|---|
| 6,597,193 B2 | 7/2003 | Lagowski et al. |
| 6,882,172 B1 | 4/2005 | Suzuki et al. |
| 6,900,690 B2 | 5/2005 | Kang et al. |
| 7,149,674 B1 | 12/2006 | Sirichotiyakul et al. |

(Continued)

OTHER PUBLICATIONS

Eitan N. Shauly, "CMOS Leakage and Power Reduction in Transistors and Circuits: Process and Layout Considerations", Journal of Low Power Electron Application, 2012, 2, 1-29.

*Primary Examiner* — Vinh Nguyen
(74) *Attorney, Agent, or Firm* — Law Offices of Ira D. Blecker, P.C.

(57) ABSTRACT

Method of measuring semiconductor device leakage which includes: providing a semiconductor device powered by a supply voltage and having a circuit block of transistors; providing on the semiconductor device a test circuit providing an input to a counter and a fixed-frequency measurement clock to provide a clock signal to the counter; disconnecting a system clock from the circuit block; receiving by the test circuit the supply voltage as an input; initializing the counter; starting the counter when the supply voltage is at or below a first voltage $V_{high}$; monitoring a decrease of the supply voltage with time; stopping the counter when the supply voltage is at or below a second voltage $V_{low}$ such that $V_{high}$ is greater than $V_{low}$; and reading the counter to provide the semiconductor device leakage metric. Also disclosed is an apparatus and a computer program product.

20 Claims, 9 Drawing Sheets

(56) References Cited

U.S. PATENT DOCUMENTS

| | | | |
|---|---|---|---|
| 7,564,274 B2* | 7/2009 | Hughes | H03K 17/165 327/108 |
| 8,736,314 B2* | 5/2014 | Kim | H03K 19/0016 327/108 |
| 2012/0053897 A1 | 3/2012 | Naffziger | |

* cited by examiner

ON-CHIP LEAKAGE MEASUREMENT

This invention was made with Government support under Contract No.: HR0011-13-C-0022 awarded by Defense Advanced Research Projects Agency (DARPA), Project DARPA PERFECT, Pradip Bose, HR0011-13-C-0022. The Government has certain rights in this invention.

BACKGROUND

The present exemplary embodiments pertain to semiconductor device circuits and, more particularly, pertain to measurement of transistor leakage by an apparatus located on the semiconductor device.

One of the challenges facing the users and designers of integrated circuits is managing the power produced by a semiconductor device, also referred to as a chip. The power dissipated by a digital chip has two basic sources which are switching current and leakage current. When a gate is switching from one logical value to another, there is a brief period of time where current passes through the transistors dissipating power in the form of heat. Historically, this switching current has been the focus of the designer's attention because it was substantially greater than the nominal leakage current that occurred when the gate was not switching and the transistors were "off".

However, with smaller geometries and reduced operating voltages, the leakage current is a significantly larger proportion of the power production problem. One of the challenges is accurately measuring the amount of leakage current that is actually present on a particular chip.

BRIEF SUMMARY

The various advantages and purposes of the exemplary embodiments as described above and hereafter are achieved by providing, according to one aspect of the exemplary embodiments, a method of measuring semiconductor device leakage comprising: providing a semiconductor device powered by a supply voltage and having at least one circuit block comprising a plurality of transistors; providing on the semiconductor device a test circuit providing an input to a counter and a fixed-frequency measurement clock to provide a clock signal to the counter, wherein the counter providing a semiconductor device leakage metric; disconnecting a system clock from the circuit block, the system clock, in the absence of the disconnecting, causes the circuit block to switch from a first state to a second state; receiving by the test circuit the supply voltage as an input; initializing the counter; starting the counter when the supply voltage is at or below a first voltage $V_{high}$; monitoring a decrease of the supply voltage with time; stopping the counter when the supply voltage is at or below a second voltage $V_{low}$ such that $V_{high}$ is greater than $V_{low}$; and reading the counter to provide the semiconductor device leakage metric.

According to another aspect of the exemplary embodiments, there is provided an apparatus for measuring semiconductor device leakage comprising: a semiconductor device powered by a supply voltage and having at least one circuit block comprising a plurality of transistors; a system clock on the semiconductor device; a test circuit provided on the semiconductor device to measure semiconductor device leakage; a power supply to provide a fixed voltage to the test circuit to power the test circuit. The test circuit comprising a voltage monitor to output a first value indicative of a first voltage, $V_{high}$ and a second value indicative of second voltage, $V_{low}$ wherein $V_{high}$ is greater than $V_{low}$. The apparatus further comprising a fixed-frequency measurement clock separate from the system clock; a counter for providing a semiconductor device leakage metric and receiving an input from the fixed-frequency measurement clock and receiving an input from the test circuit; responsive to the voltage monitor outputting the first value, the counter starts counting; responsive to the voltage monitor outputting the second value, the counter stops counting.

According to a further aspect of the exemplary embodiments, there is provided a computer program product for measuring semiconductor device leakage on a semiconductor device powered by a supply voltage and having at least one circuit block comprising a plurality of transistors and providing on the semiconductor device a test circuit, a fixed-frequency measurement clock and a counter for providing a semiconductor device leakage metric such that the test circuit and fixed-frequency measurement clock both providing an input to the counter, the computer program product comprising a computer readable storage medium having program instructions embodied therewith, the program instructions executable by a computing device to cause the device to perform a method comprising: disconnecting a system clock from the circuit block, wherein the system clock, in the absence of the disconnecting, causes the circuit block to switch from a first state to a second state; receiving by the test circuit the supply voltage as an input; initializing the counter; starting the counter when the supply voltage is at or below a first voltage $V_{high}$; monitoring a decrease of the supply voltage with time; stopping the counter when the supply voltage is at or below a second voltage $V_{low}$ such that $V_{high}$ is greater than $V_{low}$; and reading the counter to provide the semiconductor device leakage metric.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

The exemplary embodiments target on-chip measurement of leakage, which may be enabled in the field at a customer's site. Leakage measurement may be important in tracking life time reliability, as well as effectiveness of power management, and customer usage patterns in the field.

Leakage or leakage current may be thought of as current between source and drain across the channel or from gate to source when there is no switching of the circuit.

The exemplary embodiments measure leakage by observing the time of transition from a higher voltage to a lower voltage for a circuit block when no switch activity may be present in the circuit block.

Figure 1:
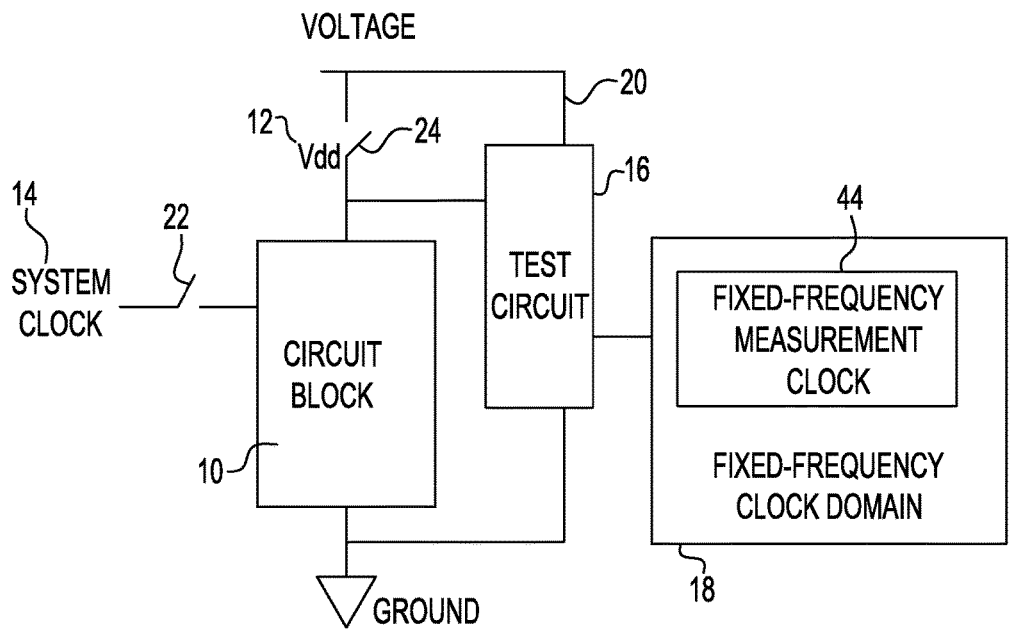
FIG. 1 is an exemplary embodiment of an apparatus for measuring on-chip leakage current.

Referring to the Figures in more detail, and particularly referring to FIG. 1, there is shown one exemplary embodiment of an apparatus for practicing the present invention. Circuit block 10, representing one portion of a larger semiconductor device (not shown), is powered by a voltage on the power rail of the transistors of the circuit block. This voltage is conventionally referred to as the Vdd voltage 12. Vdd voltage may also be referred to generically as the supply voltage. Connected to circuit block 10 may be a system clock 14. This exemplary embodiment further includes a test circuit 16 connected to a fixed-frequency measurement clock 44 in a fixed-frequency clock domain 18.

The test circuit 16 may be powered by the same source that provides the Vdd voltage 12 to circuit block 10.

The test circuit 16 and the fixed-frequency measurement clock domain 18 will be described in more detail hereafter.

In operation of this exemplary embodiment, the system clock 14 may be disconnected as indicated by open switch 22 to ensure that the circuit block 10 does not undergo switching during measurement of leakage. The Vdd voltage 12 may also be disconnected as indicated by open switch 24 so that circuit block 10 is no longer powered. Since the circuit block 10 is no longer powered, the Vdd voltage 12 may drift lower with time. This exemplary embodiment measures the time that the Vdd voltage 12 takes to drift lower between two reference voltages $V_{high}$ and $V_{low}$. The Vdd voltage 12 may eventually drift to zero with time.

Figure 2:
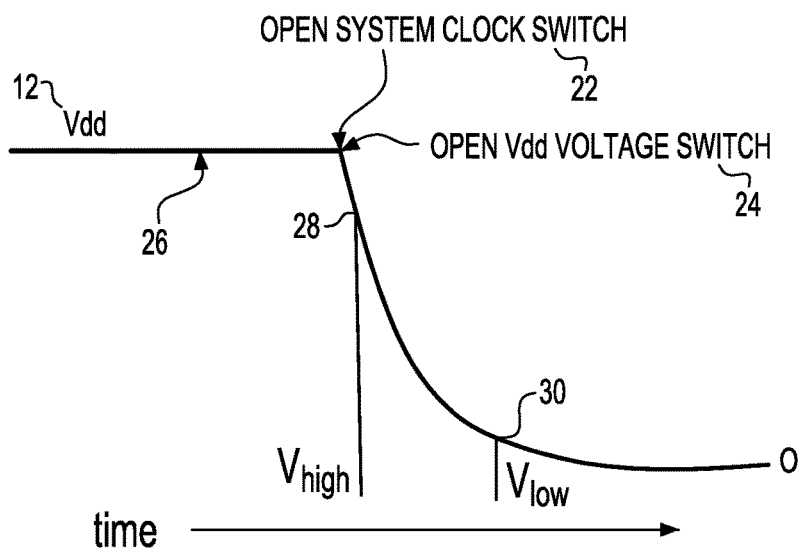
FIG. 2 is a graph of voltage versus time pertaining to the exemplary embodiment of FIG. 1.

Referring now to FIG. 2, there is a graph of voltage versus time. The curve 26 illustrates a constant Vdd voltage 12 until the system clock switch 22 is opened and the Vdd voltage switch 24 is opened. The curve 26 then starts to drift lower. At a point 28 at or just below where the system clock switch 22 is opened, the Vdd voltage 12 may be referenced as $V_{high}$. At a point 30 lower on the curve 26 but above zero, the Vdd voltage 12 may be referenced as $V_{low}$.

The time for the Vdd voltage 12 to transition from $V_{high}$ to $V_{low}$ is measured and may be used as a metric to measure leakage. In one example, the time to transition from $V_{high}$ to $V_{low}$ may be measured when the semiconductor device is new and then compared to a later value of the transition time when the semiconductor device may be in the field. A shorter transition time at a later time may indicate greater leakage.

Figure 3:
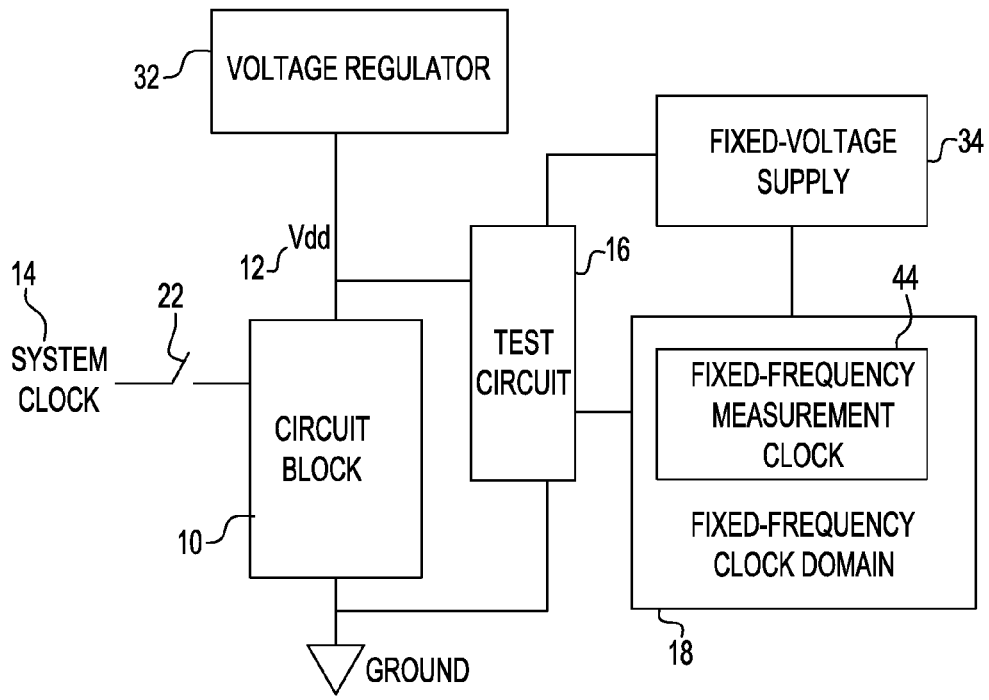
FIG. 3 is another exemplary embodiment of an apparatus for measuring on-chip leakage current.

Referring now to FIG. 3, there is illustrated another exemplary embodiment of an apparatus for practicing the present invention. Components in FIG. 3 that are similar to components of FIG. 1 are numbered the same. That is, the apparatus in FIG. 3 includes a circuit block 10 powered by Vdd voltage 12. Circuit block 10 may be connected to system clock 14. In addition, there may be a test circuit 16 connected to a fixed-frequency measurement clock 44 in a fixed-frequency clock domain 18.

The exemplary embodiment of FIG. 3 may further include a voltage regulator 32 to supply a Vdd voltage 12 and may further include a fixed voltage supply 34 for the test circuit 16.

In operation of this exemplary embodiment, the system clock 14 may be disconnected as indicated by open switch 22 to ensure that the circuit block 10 does not undergo switching during measurement of leakage. The voltage regulator 32 may step down the Vdd voltage 12 to a lower voltage than the Vdd voltage. This exemplary embodiment measures the time that the Vdd voltage 12 takes to drift lower between two reference voltages $V_{high}$ and $V_{low}$. The Vdd voltage 12 may eventually drift down to the imposed voltage with time. The lower regulated voltage preferably is less than $V_{low}$.

Figure 4:
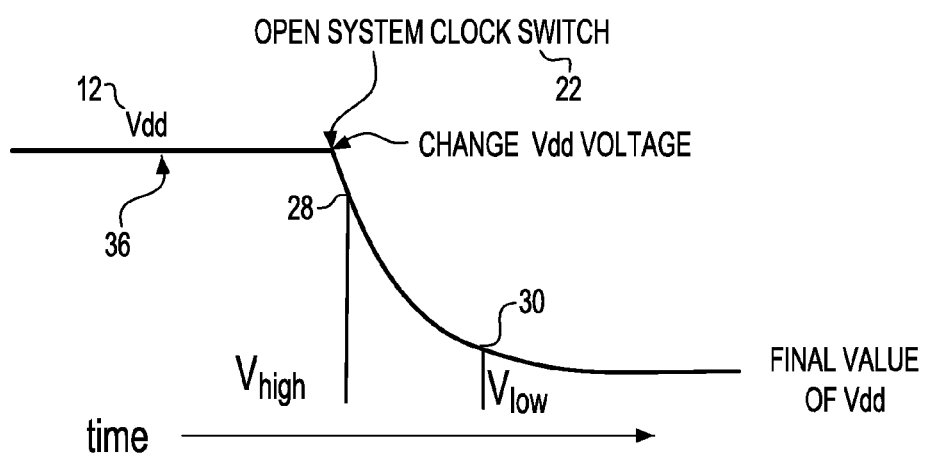
FIG. 4 is a graph of voltage versus time pertaining to the exemplary embodiment of FIG. 3.

Referring now to FIG. 4, there is a graph of voltage versus time. The curve 36 illustrates a constant Vdd voltage 12 until the system clock switch 22 is opened and a new Vdd voltage is imposed on the circuit block 10 by the voltage regulator 32. The curve 36 then starts to drift lower. At a point 28 at or just below where the system clock switch 22 is opened, the Vdd voltage 12 may be referenced as $V_{high}$. At a point 30 lower on the curve 36 but above the final value of Vdd (the voltage imposed by the voltage regulator 32), the Vdd voltage 12 may be referenced as $V_{low}$. $V_{low}$ should always be higher, even by a small amount, than the final value Vdd.

Figure 5:
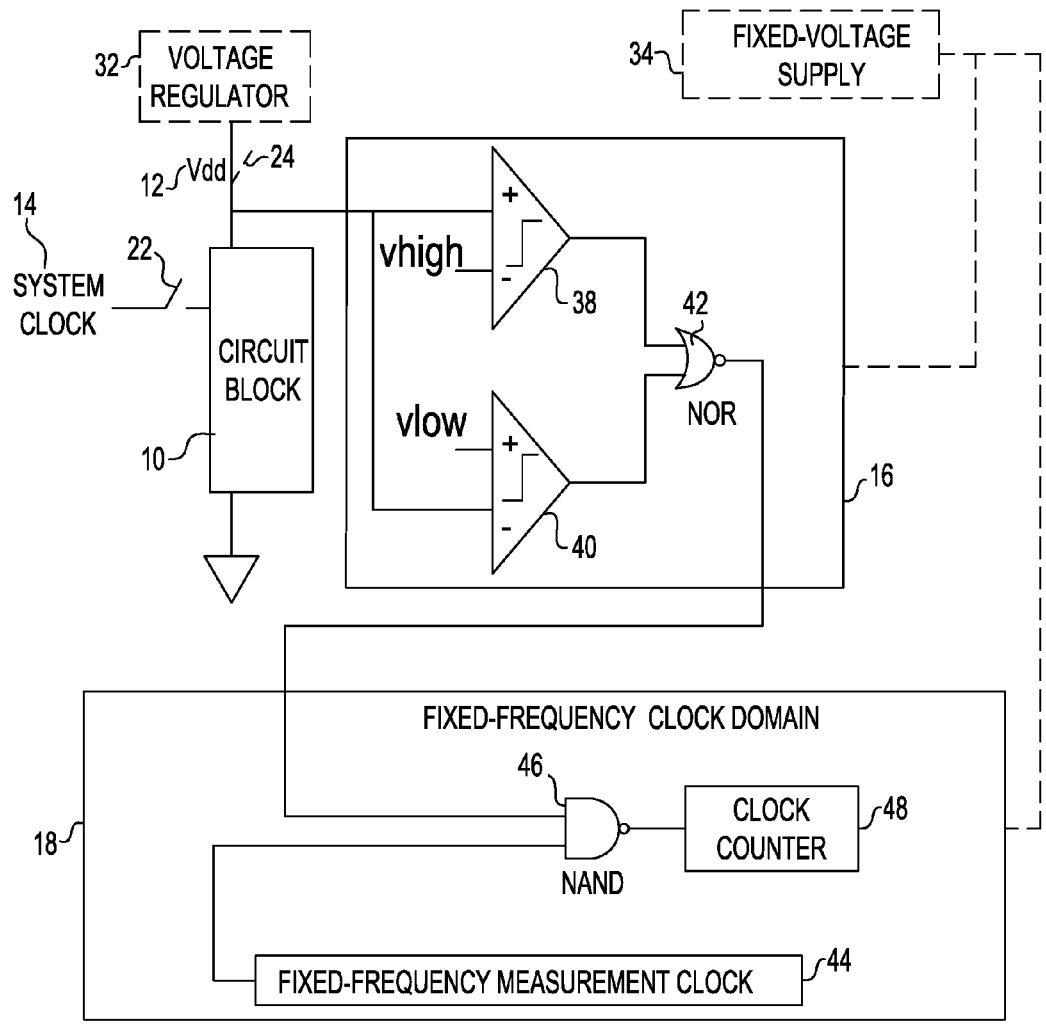
FIG. 5 is an exemplary circuit diagram for the exemplary embodiments of FIGS. 1 and 3.

Referring now to FIG. 5, there is illustrated an exemplary circuit diagram for the apparatus illustrated in FIGS. 1 and 3. The test circuit 16 may be implemented by $V_{high}$ voltage comparator 38, a $V_{low}$ voltage comparator 40 and a NOR gate 42.

The test circuit 16 may be connected to fixed-frequency clock domain 18. The fixed-frequency clock domain 18 may further include a fixed-frequency measurement clock 44, a NAND gate 46 and a clock counter 48. The NAND gate 46 receives an input from both the test circuit 16 and the fixed-frequency measurement clock 44.

It is understood that every clocked element (e.g., flip-flops, latches) within the fixed frequency clock domain 18 connects to and operates at the fixed frequency measurement clock 44.

Figure 6:
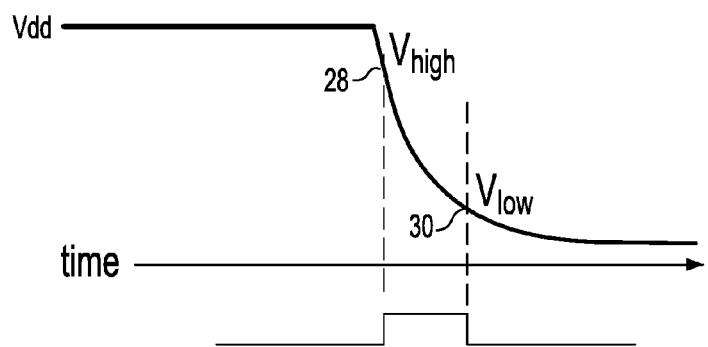
FIG. 6 is a graph of voltage versus time pertaining to the exemplary circuit diagram of FIG. 5.

The test circuit 16 shown in FIG. 5 may produce an enabling signal as described below to the clock input of the clock counter 48 between $V_{high}$ and $V_{low}$ as indicated in FIG. 6.

At the beginning of testing, the clock counter 48 may be read or simply reset to zero, the Vdd voltage 12 may be initially higher than $V_{high}$. When the Vdd voltage is between $V_{high}$ and $V_{low}$, both comparators 38, 40 may produce a "0" and the output of the NOR gate 42 is a "1". When the NOR gate 42 outputs a "1" to the NAND gate 46, the NAND gate 46 lets a clock signal from the fixed-frequency measurement clock 44 pass through the NAND gate 46 to the clock counter 48, therefore enabling the clock counter 48 to count the number of clock ticks during this period. When the Vdd voltage 12 finally reaches $V_{low}$ or lower, the $V_{low}$ voltage comparator 40 now produces a signal of "1", the NOR gate 42 output is set to "0" and the clock counter 48 is disabled.

The clock counter 48 contains the number of clock ticks during the voltage transition between $V_{high}$ and $V_{low}$. The system may now read and record the clock counter 48 for the transition time between $V_{high}$ and $V_{low}$, and then translate this transition time to leakage value by, for example, using a pre-calibrated translation time look-up table.

When the clock counter 48 may be initialized, either by resetting the clock counter to zero or by reading the current value of the clock counter 48, the clock counter 48 may only need to be read when the NOR gate 42 output is set to "0" to obtain the transition time.

In the circuit diagram of FIG. 5, the Vdd voltage switch 24 would be opened for the exemplary embodiment of FIG. 1. For the exemplary embodiment of FIG. 3, the Vdd voltage switch 24 (indicated by dashed lines) would be closed and there would be the voltage regulator 32 (indicated by dashed lines) and the fixed voltage supply 34. It is understood that every element within the fixed frequency clock domain 18 connects to and operates under the fixed voltage supply 34.

Figure 7:
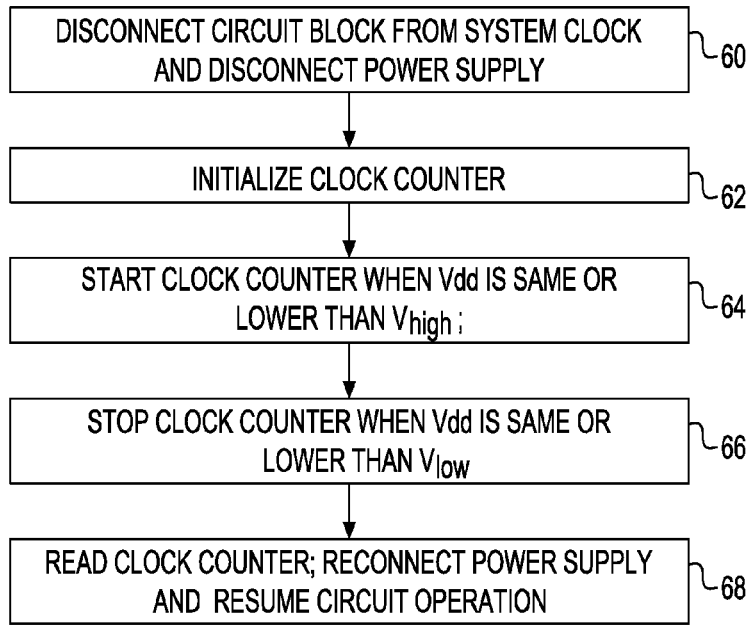
FIG. 7 is an exemplary embodiment of a method for measuring on-chip leakage current using the apparatus of FIG. 1.

Referring now to FIG. 7, there is illustrated another exemplary embodiment of a method of measuring leakage using the apparatus of FIGS. 1 and 5. The circuit block 10 under test is disconnected from the system clock 14 and power supply (Vdd voltage) 12, block 60.

The clock counter may be initialized, block 62. The clock counter 48 may be initialized by reading the clock counter 48 or setting the clock counter 48 to zero.

The clock counter 48 is started, box 64.

When the Vdd voltage 12 is the same or lower than $V_{low}$, the clock counter 48 is stopped, box 66.

The clock counter 48 may be read. Finally, the power supply (Vdd voltage) 12 and system clock 14 are reconnected to the circuit block 10, block 68.

Figure 8:
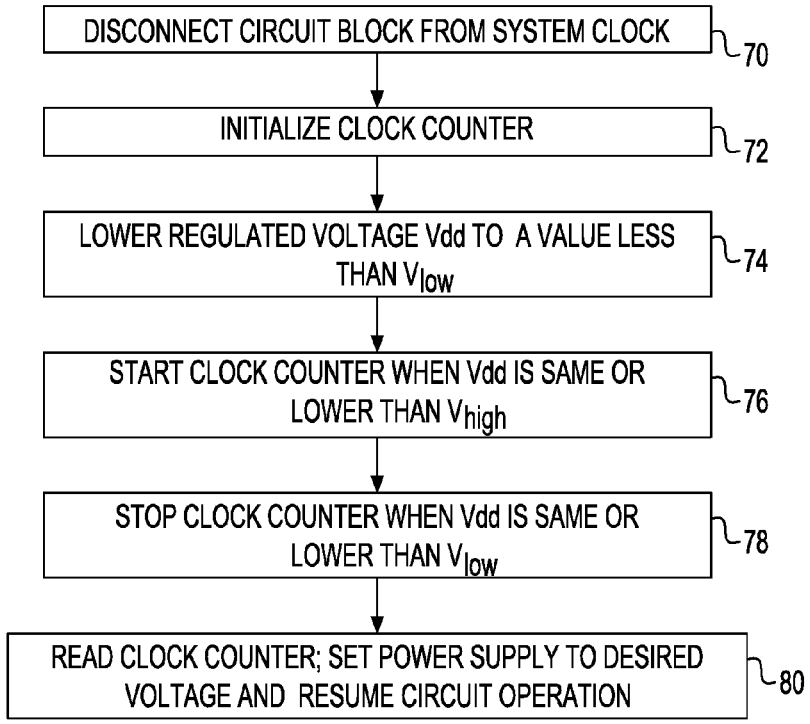
FIG. 8 is another exemplary embodiment of a method for measuring on-chip leakage current using the apparatus of FIG. 3.

Referring now to FIG. 8, there is illustrated another exemplary embodiment of a method of measuring leakage using the apparatus of FIGS. 3 and 5. The circuit block 10 under test is disconnected from the system clock 14, block 70.

The clock counter may be initialized, block 72. The clock counter 48 may be initialized by reading the clock counter 48 or setting the clock counter 48 to zero.

The voltage regulator 32 lowers the Vdd voltage 12 to a value less than $V_{low}$, box 74.

The clock counter 48 is started, box 76.

When the Vdd voltage 12 is the same or lower than $V_{low}$, the clock counter 48 is stopped, box 78.

The clock counter 48 may be read, box 80. Finally, the system clock 14 is reconnected to the circuit block 10, block 80 and the power supply sets Vdd to the desired voltage.

Figure 9:
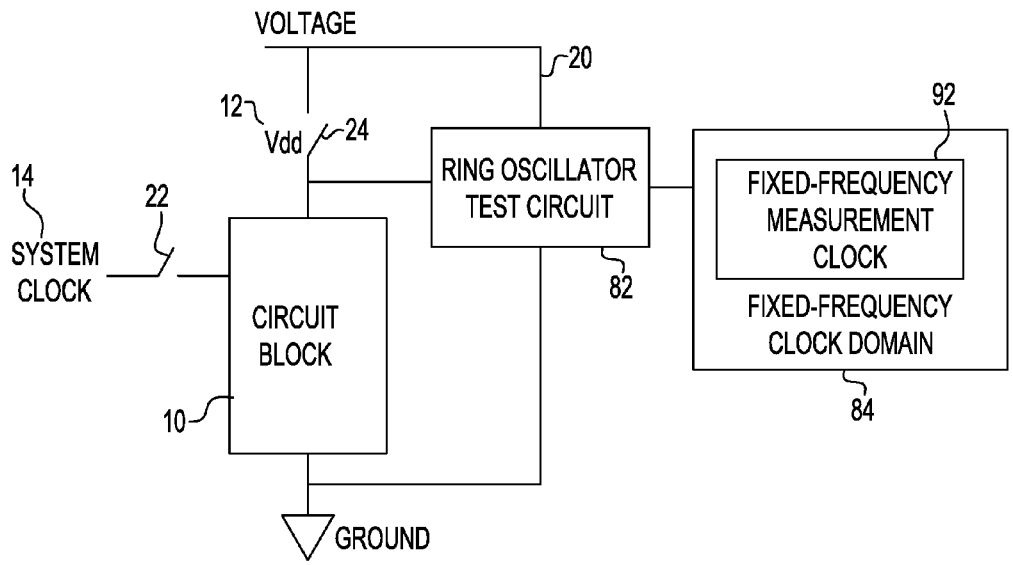
FIG. 9 is a further exemplary embodiment of an apparatus for measuring on-chip leakage current.

Referring now to FIG. 9, there is illustrated another exemplary embodiment of an apparatus for practicing the present invention. Components in FIG. 9 that are similar to components of FIG. 1 are numbered the same. The difference between the exemplary embodiment of FIG. 9 and the exemplary embodiment of FIG. 1 is that the test circuit 16 of FIG. 1 has been replaced by a ring oscillator test circuit 82 and the fixed-frequency clock domain 18 of FIG. 1 has been replaced by a different fixed-frequency clock domain 84. The exemplary embodiment in FIG. 9 illustrates the embodiment where no voltage is imposed on the circuit block 10 as in FIG. 1.

The apparatus in FIG. 9 includes a circuit block 10 powered by Vdd voltage 12. Circuit block 10 may be connected to system clock 14. In addition, there may be a ring oscillator test circuit 82 connected to a fixed-frequency measurement clock 92 in a fixed-frequency clock domain 18. The fixed-frequency measurement clock 92 may be the same or different from the fixed-frequency measurement clock 44 described with respect to FIGS. 1 to 6.

In operation of this exemplary embodiment, the system clock 14 may be disconnected as indicated by open switch 22 to ensure that the circuit block 10 does not undergo switching during measurement of leakage. The Vdd voltage 12 may also be disconnected as indicated by open switch 24 so that circuit block 10 is no longer powered. Since the circuit block 10 is no longer powered, the Vdd voltage 12 may drift lower with time.

A ring oscillator is a device composed of an odd number of NOT gates whose output oscillates between two voltage levels, representing true and false. The NOT gates, or inverters, are attached in a chain and the output of the last inverter is fed back into the first.

At a high voltage, the free running ring oscillator has a higher ring oscillator count per unit of time than at a lower voltage. The time to switch from a high RO count to a low RO count during a recording period by observing the readings in one or more history registers may be a proxy for leakage. The transition time from a high RO count to a low RO count may be translated to leakage value by using a pre-calibrated translation look-up table.

The ring oscillator count is the number of times around the ring oscillator chain per the unit of time. The ring oscillator count may be referred to as the RO count. This RO count is recorded for a period of the fixed-frequency measurement clock, referred to as an RO Measurement period. The RO Measurement period may be typically in nanoseconds and may represent one or more clock cycles.

The RO counts may be recorded during the RO Measurement period and placed in one or more history registers. RO counts may be continually recorded and placed in the history registers. However, since there may not be much change between one RO Measurement period and the next RO Measurement period, several RO Measurement periods may be skipped before the next RO Measurement period may be recorded. The interval between RO Measurement periods that may be recorded may be, for example, two or more clock cycles.

Figure 10:
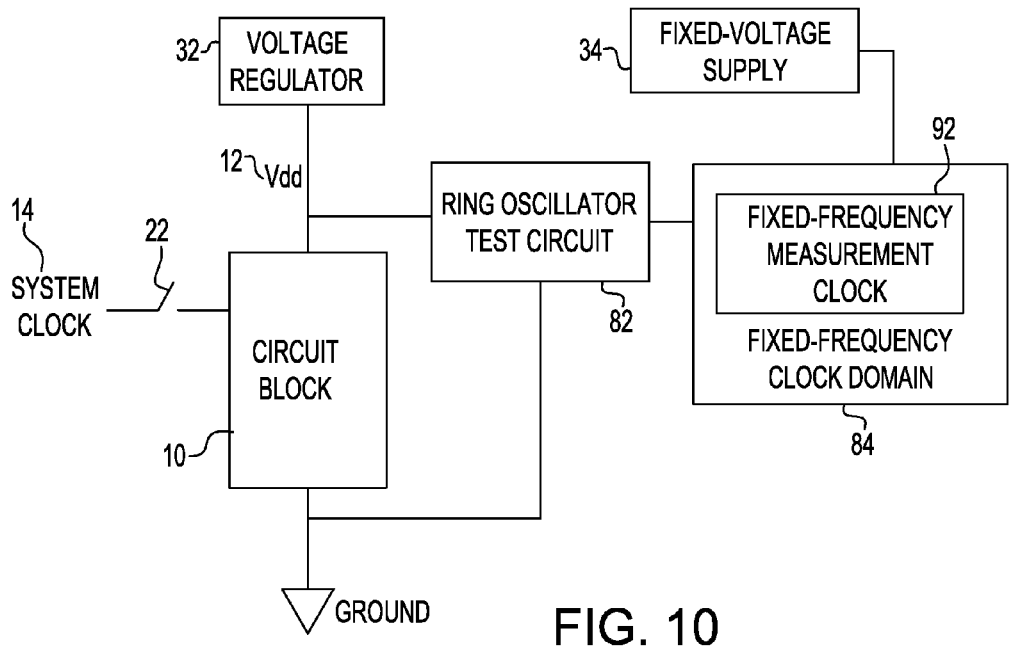
FIG. 10 is yet another exemplary embodiment of an apparatus for measuring on-chip leakage current.

Referring now to FIG. 10, there is illustrated another exemplary embodiment of an apparatus for practicing the present invention. Components in FIG. 10 that are similar to components of FIG. 3 are numbered the same. The difference between the exemplary embodiment of FIG. 10 and the exemplary embodiment of FIG. 3 is that the test circuit 16 of FIG. 3 has been replaced by a ring oscillator test circuit 82 and the fixed-frequency measurement clock domain 18 of FIG. 3 has been replaced by a different fixed-frequency measurement clock domain 84. The exemplary embodiment in FIG. 10 illustrates the embodiment where a voltage may be imposed on the circuit block 10 as in FIG. 3.

The apparatus in FIG. 10 includes a circuit block 10 powered by Vdd voltage 12. Circuit block 10 may be connected to system clock 14. In addition, there may be a ring oscillator test circuit 82 connected to a fixed-frequency measurement clock 92 in a fixed-frequency clock domain 84.

In operation of this exemplary embodiment, the system clock 14 may be disconnected as indicated by open switch 22 to ensure that the circuit block 10 does not undergo switching during measurement of leakage. The voltage regulator 32 steps down the Vdd voltage 12 to a lower voltage than the Vdd voltage. The Vdd voltage 12 will eventually drift down to the imposed voltage with time. The ring oscillator test circuit 82 would operate as described above with respect to the FIG. 9 exemplary embodiment.

Figure 11:
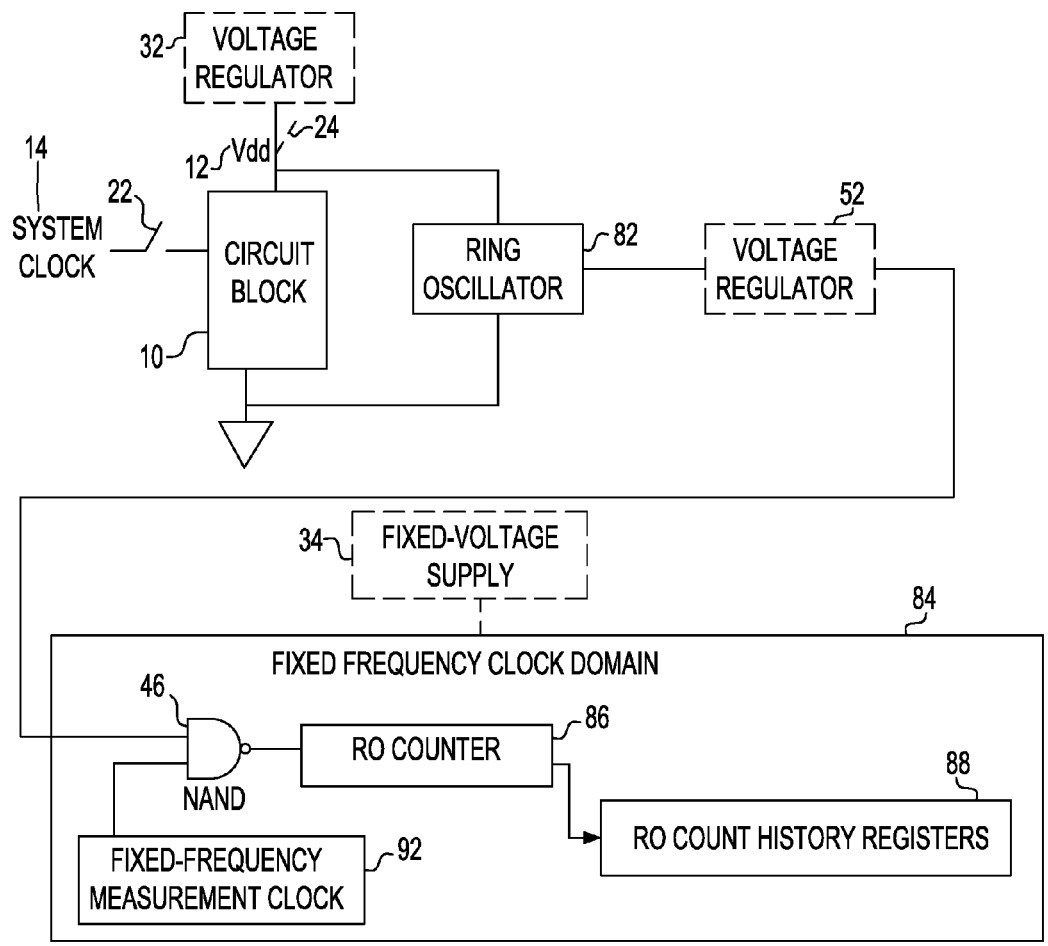
FIG. 11 is an exemplary circuit diagram for the exemplary embodiments of FIGS. 9 and 10.

Referring now to FIG. 11, there is illustrated an exemplary circuit diagram for the apparatus illustrated in FIGS. 9 and 10.

The ring oscillator test circuit 82 provides an output to the NAND gate 46. A signal from the fixed-frequency measurement clock 44 and the output from the ring oscillator test circuit 82 may pass through the NAND gate 46 to the ring oscillator (RO) counter 86. Any counts from the RO counter 86 may be passed to one or more history registers 88. It is understood that every clocked element (e.g., flip-flops, latches) within the fixed frequency clock domain 84 connects to and operates at the fixed frequency measurement clock 92.

FIG. 11 also shows a voltage converter 52. For cases where the ring oscillator test circuit 82 may be operating at a higher voltage than the circuit block 10 under test, a voltage converter 52 may be needed to boost the signal out of the ring oscillator 82 to the NAND logic gate 46. A voltage converter 52 may not be needed if the circuit block 10 under test operates at a higher voltage than the ring oscillator test circuit 82 during the duration of the test.

Further, in the circuit diagram of FIG. 11 where a voltage is imposed on the circuit block 10 such as with the FIG. 10 embodiment, the Vdd voltage switch 24 (indicated by dashed lines) would be closed, there would be the voltage regulator 32 (indicated by dashed lines) and fixed voltage source 34 (indicated by dashed lines). It is understood that every element within the fixed frequency clock domain 84 connects to and operates under the fixed voltage supply 34.

Figure 12:
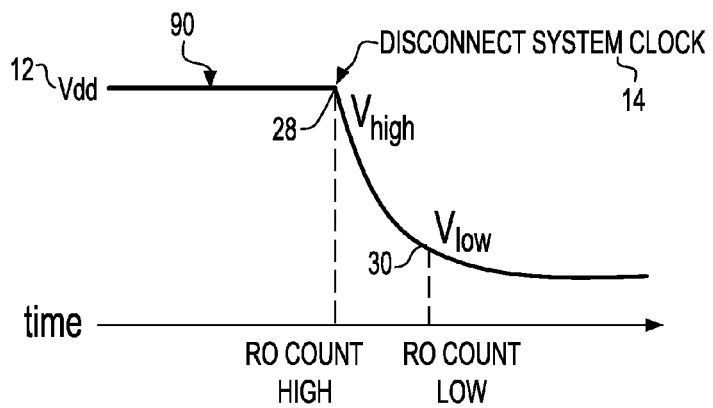
FIG. 12 is a graph of voltage versus time pertaining to the exemplary circuit diagram of FIG. 11.

Referring now to FIG. 12, there is a graph of voltage versus time. The curve 90 illustrates a constant Vdd voltage 12 until the system clock switch 22 is opened. As described previously, the curve 90 would be similar whether the voltage is disconnected from the circuit block 10 or if a voltage is imposed on the circuit block 10. The curve 90 then starts to drift lower, either because the Vdd voltage has been disconnected or because the voltage regulator 32 causes the Vdd voltage to drift to a lower voltage than $V_{low}$. At a point 28 at or just below where the system clock switch 22 is opened, the Vdd voltage 12 may be referenced as $V_{high}$. At a point 30 lower on the curve 90, the Vdd voltage 12 may be referenced as $V_{low}$.

Just before the system clock switch 22 is opened, the RO counter 86 is initialized. Initialization may be, for example, by reading the RO counter 86 or by setting the RO counter 86 to zero. The RO counter 86 may then be started before the system clock switch 22 is opened.

Figure 13:
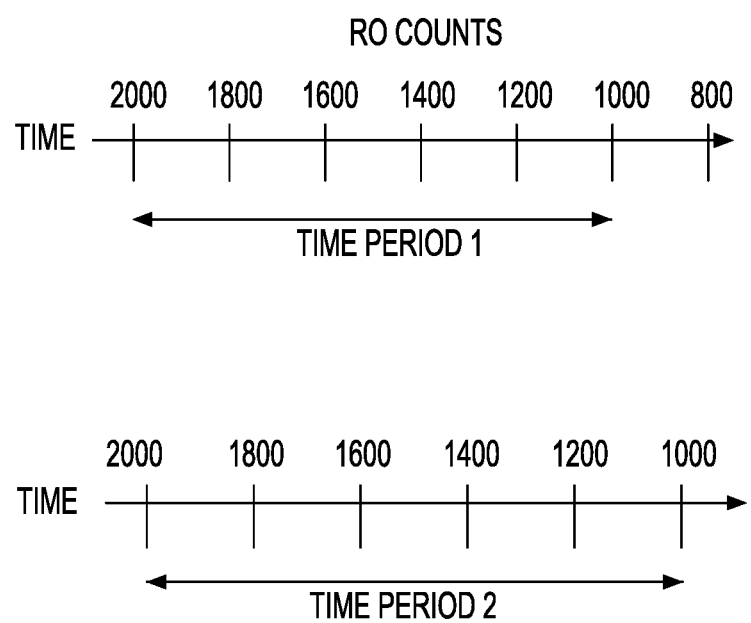
FIG. 13 is an example of clock counts for the exemplary embodiments of FIGS. 9 and 10.

At point 28 ($V_{high}$) and at point 30 ($V_{low}$), the RO count during an RO Measurement period may be counted by the RO counter 86. There may be, and usually will be, RO counts and RO Measurement periods between points 28 and 30. Referring now to FIG. 13, there is illustrated the RO counts and RO Measurement periods for a time period 1. The time period 1 starts at a first RO Measurement period having 2000 counts ($V_{high}$) and ends at a subsequent RO Measurement period having 1000 counts ($V_{low}$). The counts may be per clock cycle or some multiple of clock cycles of the fixed-frequency measurement clock 92. At some time later, which could be days, weeks or even years, time period 2 measures the time between a first RO Measurement period having 2000 counts ($V_{high}$) and 1000 counts ($V_{low}$). Again, the counts may be per clock cycle or some multiple of clock cycles of the fixed-frequency measurement clock 92. It can be seen that the time between the RO Measurement period having 2000 counts ($V_{high}$) and the subsequent RO Measurement period having 1000 counts ($V_{low}$) is longer in time period 2 indicating greater leakage during time period 2.

In both time period 1 and time period 2, the RO counts, such as 1800, 1600, etc., between the first RO Measurement period having 2000 counts and the subsequent RO Measurement period having 1000 counts represent RO counts during other RO Measurement periods.

It should be understood that the example data shown in FIG. 13 is for the purpose of illustration and not limitation.

$V_{high}$ may be easily determined as it occurs just before the system clock 14 is disconnected from the circuit block 10. $V_{low}$ may be determined by running an initial test in which the RO counter counts until the Vdd voltage reaches zero (in the case where the Vdd voltage is disconnected from the circuit block 10) or until the Vdd voltage reaches the imposed voltage (in the case where the Vdd voltage is imposed by the voltage regulator 34). In this way, a meaningful endpoint threshold above zero in the case where the Vdd voltage is allowed to go to zero or above the imposed voltage may be selected for $V_{low}$ in which the RO counter 86 may stop counting.

Alternatively, $V_{low}$ may be arbitrarily chosen to have an RO count substantially below the RO count for $V_{high}$. In the example shown in FIG. 13, $V_{low}$ may be selected to have an RO count during the RO Measurement period of 1000 counts.

Figure 14:
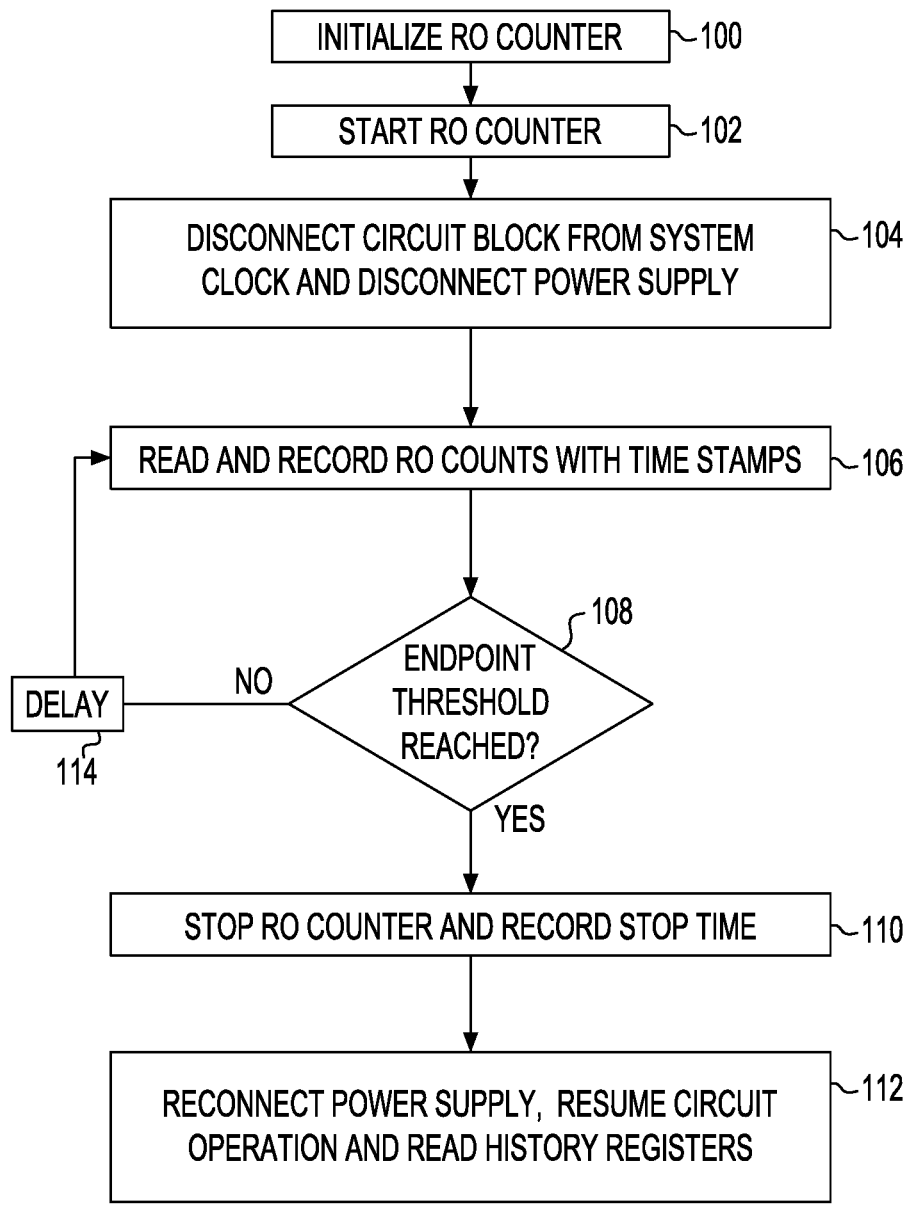
FIG. 14 is a further exemplary embodiment of a method for measuring on-chip leakage current using the apparatus of FIG. 9.

Referring now to FIG. 14, there is illustrated another exemplary embodiment of a method of measuring leakage using the apparatus of FIGS. 9 and 11.

The RO counter 86 may be initialized, box 100, as described previously to begin the method. Thereafter, the RO counter 86 may be started, box 102.

Following the start of the RO counter 86, the system clock 14 and Vdd voltage 12 may be disconnected from the circuit block 10, box 104.

The RO counts are then read and recorded with time stamps, box 106. At this time, the RO counts may be stored in the RO count history registers 88.

The method proceeds to determine if the endpoint threshold has been reached, box 108. This endpoint threshold may be $V_{low}$ which was previously determined as described previously or, alternatively, was assigned a meaningful value.

If the endpoint threshold has not been reached, the method proceeds on the "NO" path to again read and record RO counts with time stamps, box 106. As noted previously, there may not be a significant difference between RO counts in sequential RO Measurement periods. Thus, it may be desirable to institute a delay, box 114, to delay reading the RO counts for some multiple of RO Measurement periods or clock cycles. Again, this delay may be, for example, two clock cycles or more.

If the endpoint threshold has been reached, the method proceeds on the "YES" path to stop the RO counter 86 and record the stop time, box 110. This information may be stored in the RO count history registers 88.

Then, the Vdd voltage 12 and system clock 14 may be reconnected to resume normal system operation. The RO count history registers 88 may be read and evaluated to determine leakage, box 112.

Figure 15:
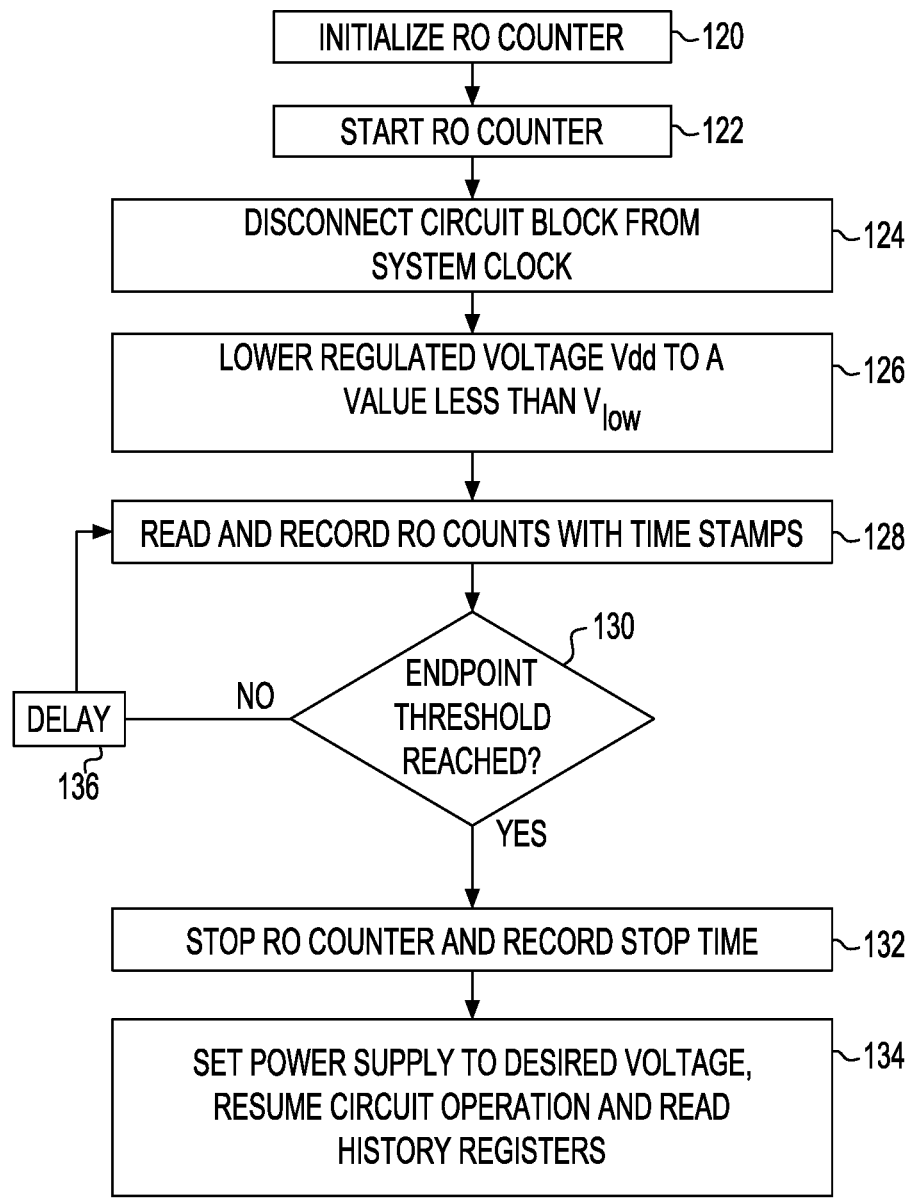
FIG. 15 is yet another exemplary embodiment of a method for measuring on-chip leakage current using the apparatus of FIG. 10.

Referring now to FIG. 15, there is illustrated another exemplary embodiment of a method of measuring leakage using the apparatus of FIGS. 10 and 11.

The RO counter 86 may be initialized to begin the method, box 120. Thereafter, the RO counter 86 may be started, box 122.

Following the start of the RO counter 86, the system clock 14 may be disconnected from the circuit block 10, box 124.

The voltage regulator 32 may impose a Vdd voltage on the circuit block 10, box 126. The imposed Vdd voltage preferably is less than $V_{low}$.

The RO counts are then read and recorded with time stamps, box 128. At this time, the RO counts may be stored in the RO count history registers 88.

The method proceeds to determine if the endpoint threshold has been reached, box 130. This endpoint threshold may be $V_{low}$ which was previously determined as described previously or, alternatively, was assigned a meaningful value.

If the endpoint threshold has not been reached, the method proceeds on the "NO" path to again read and record RO counts with time stamps, box 128. As noted previously, there may not be a significant difference between RO counts in sequential RO Measurement periods. Thus, it may be desirable to institute a delay, box 136, to delay reading the RO counts for some multiple of RO Measurement periods or clock cycles. Again, this delay may be, for example, two clock cycles or more.

If the endpoint threshold has been reached, the method proceeds on the "YES" path to stop the RO counter 86 and record the stop time, box 132. This information may be stored in the RO count history registers 88.

Then, the Vdd voltage 12 may be set to the desired voltage and the system clock 14 may be reconnected to resume normal system operation. The RO count history registers 88 may be read and evaluated to determine leakage, box 134.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of measuring semiconductor device leakage comprising:
    providing a semiconductor device powered by a supply voltage and having at least one circuit block comprising a plurality of transistors;
    providing on the semiconductor device a test circuit providing an input to a counter and a fixed-frequency measurement clock to provide a clock signal to the counter, wherein the counter providing a semiconductor device leakage metric;
    disconnecting a system clock from the circuit block, wherein the system clock, in the absence of the disconnecting, causes the circuit block to switch from a first state to a second state;
    receiving by the test circuit the supply voltage as an input;
    initializing the counter;
    starting the counter when the supply voltage is at or below a first voltage $V_{high}$;
    monitoring a decrease of the supply voltage with time;
    stopping the counter when the supply voltage is at or below a second voltage $V_{low}$ such that $V_{high}$ is greater than $V_{low}$; and
    reading the counter to provide the semiconductor device leakage metric.

2. The method of claim 1 further comprising disconnecting the supply voltage from the circuit block after disconnecting the system clock.

3. The method of claim 2 further comprising, after reading the counter, connecting the supply voltage to the circuit block and connecting the system clock to the circuit block.

4. The method of claim 1 further comprising, prior to starting the counter, lowering by a voltage regulator the supply voltage to $V_{low}$.

5. The method of claim 4 further comprising, after reading the counter, setting, by the voltage regulator, the supply voltage to a desired voltage and connecting the system clock to the circuit block.

6. The method of claim 1 wherein the test circuit comprises a ring oscillator and the counter is a ring oscillator counter.

7. The method of claim 6 further comprising reading and recording ring oscillator counts with time stamps from the ring oscillator counter and storing the ring oscillator counts in one or more history registers;
    wherein monitoring a decrease of the supply voltage with time further comprising determining if an endpoint threshold at $V_{low}$ has been reached and further comprising reading and recording ring oscillator counts with time stamps from the ring oscillator counter and storing the ring oscillator counts in one or more history registers until the endpoint threshold has been reached; and
    wherein reading the counter further comprising reading the one or more history registers.

8. The method of claim 1 wherein the counter is a clock counter.

9. The method of claim 1 wherein initializing the counter comprises reading a value of the counter or setting the counter to zero.

10. An apparatus for measuring semiconductor device leakage comprising:
    a semiconductor device powered by a supply voltage and having at least one circuit block comprising a plurality of transistors;
    a system clock on the semiconductor device;
    a test circuit provided on the semiconductor device to measure semiconductor device leakage;
    a power supply to provide a fixed voltage to the test circuit to power the test circuit;
    the test circuit comprising a voltage monitor to output a first value indicative of a first voltage, $V_{high}$ and a second value indicative of second voltage, $V_{low}$ wherein $V_{high}$ is greater than $V_{low}$;
    a fixed-frequency measurement clock separate from the system clock;
    a counter for providing a semiconductor device leakage metric and receiving an input from the fixed-frequency measurement clock and receiving an input from the test circuit;
    responsive to the voltage monitor outputting the first value, the counter starts counting;
    responsive to the voltage monitor outputting the second value, the counter stops counting.

11. The apparatus of claim 10 wherein during an operation of the test circuit, the system clock is disconnected.

12. The apparatus of claim 10 further comprising a voltage regulator to power the circuit block and step down the supply voltage to $V_{low}$ during an operation of the test circuit.

13. The apparatus of claim 10 wherein the voltage monitor comprises a first voltage comparator providing a first output to a NOR gate and a second voltage comparator providing a second output to the NOR gate, the NOR gate providing an output to the counter when the supply voltage is simultaneously at or below $V_{high}$ and at or below $V_{low}$.

14. The apparatus of claim 10 wherein the voltage monitor comprises a ring oscillator, the ring oscillator providing ring oscillator counts to the counter, the ring oscillator counts being proportional to the supply voltage.

15. A computer program product for measuring semiconductor device leakage on a semiconductor device powered by a supply voltage and having at least one circuit block comprising a plurality of transistors and providing on the semiconductor device a test circuit, a fixed-frequency measurement clock and a counter for providing a semiconductor device leakage metric such that the test circuit and fixed-frequency measurement clock both providing an input to the counter, the computer program product comprising a non-transitory computer readable storage medium having program instructions embodied therewith, the program instructions executable by a computing device to cause the device to perform a method comprising:

disconnecting a system clock from the circuit block, wherein the system clock, in the absence of the disconnecting, causes the circuit block to switch from a first state to a second state;

receiving by the test circuit the supply voltage as an input;

initializing the counter;

starting the counter when the supply voltage is at or below a first voltage $V_{high}$;

monitoring a decrease of the supply voltage with time;

stopping the counter when the supply voltage is at or below a second voltage $V_{low}$ such that $V_{high}$ is greater than $V_{low}$; and reading the counter to provide the semiconductor device leakage metric.

16. The computer program product of claim 15 wherein the method further comprising disconnecting the supply voltage from the circuit block after disconnecting the system clock.

17. The computer program product of claim 15 wherein the method further comprising, prior to starting the counter, lowering by a voltage regulator the supply voltage to $V_{low}$.

18. The computer program product of claim 15 wherein the test circuit comprises a ring oscillator and the counter is a ring oscillator counter.

19. The computer program product of claim 18 wherein the method further comprising reading and recording ring oscillator counts with time stamps from the ring oscillator counter and storing the ring oscillator counts in one or more history registers;

wherein monitoring a decrease of the supply voltage with time further comprising determining if an endpoint threshold at $V_{low}$ has been reached and further comprising reading and recording ring oscillator counts with time stamps from the ring oscillator counter and storing the ring oscillator counts in one or more history registers until the endpoint threshold has been reached; and wherein reading the counter further comprising reading the one or more history registers.

20. The computer program product of claim 15 wherein the counter is a clock counter.

* * * * *